United States Patent
Huynh

(10) Patent No.: US 8,687,736 B1
(45) Date of Patent: Apr. 1, 2014

(54) MULTI-BAND BANDPASS-SAMPLING RECEIVER

(71) Applicant: Phuong Thu-Minh Huynh, Fairfax, VA (US)

(72) Inventor: Phuong Thu-Minh Huynh, Fairfax, VA (US)

(73) Assignee: Phuong Huynh, Fairfax, VA (US)

( * ) Notice: Subject to any disclaimer, the term of this patent is extended or adjusted under 35 U.S.C. 154(b) by 0 days.

(21) Appl. No.: 13/709,035

(22) Filed: Dec. 9, 2012

(51) Int. Cl.
*H03D 3/00* (2006.01)
*H04L 27/06* (2006.01)

(52) U.S. Cl.
USPC .......................................... 375/322; 375/340

(58) Field of Classification Search
CPC ................. H04B 1/001; H04B 1/7075; H04B 2001/70706; H04B 2215/065; H04B 1/0017; H04L 2027/0036; H04L 2027/0065; H04L 27/38; H04L 27/3863; H04L 27/3872; H03D 3/007

USPC .................................................. 375/322, 340
See application file for complete search history.

(56) References Cited

U.S. PATENT DOCUMENTS

| | | | |
|---|---|---|---|
| 2003/0076899 A1* | 4/2003 | Kumar et al. ................. | 375/316 |
| 2009/0068974 A1* | 3/2009 | Smith ........................... | 455/304 |
| 2011/0096875 A1* | 4/2011 | Amrutur et al. .............. | 375/343 |
| 2011/0134335 A1* | 6/2011 | Laurent-Michel et al. ... | 348/731 |
| 2013/0028363 A1* | 1/2013 | Rofougaran et al. ......... | 375/350 |

\* cited by examiner

*Primary Examiner* — Don N Vo

(57) ABSTRACT

A multi-channel quadrature bandpass-sampling receiver is provided with a plurality of RF signals that are modulated at different carrier frequencies, are frequency-shifted, and are staggered to a first IF frequency. A quadrature bandpass-sampling analog-to-digital demodulator digitizes and down-converts the aggregate RF signals to a second low IF frequency, wherein each frequency-shifted RF signal can be demodulated to DC by a digital down converter.

24 Claims, 8 Drawing Sheets

MULTI-BAND BANDPASS-SAMPLING RECEIVER

FIELD OF THE INVENTION

The present invention relates to communication receivers, a quadrature bandpass-sampling delta-sigma architecture, and the simultaneous down-conversion of RF signals at different carrier frequencies.

BACKGROUND OF THE INVENTION

Mobile communication devices, such as cellular telephones, personal digital assistants, mobile personal computer terminals, etc., have become widely used as advancements have been made in mobile communication systems. Mobile communication systems may be capable of transmitting/receiving signals in various frequency bands, such as 800 MHz to 1.0 GHz, 1.5 GHz to 2.0 GHz, etc.

Components of mobile communication equipment must be miniaturized and have enhanced performance characteristics. Demand for reducing the size and manufacturing costs of mobile communication equipment is ever increasing. Additionally, studies for reducing the size and manufacturing costs of the components have been actively conducted An RF transceiver supports multiple bands (multi-bands) and multiple modes (multi-modes), and recent RF transceivers require a form factor having a smaller size due to the miniaturization of mobile communication equipment, such as cellular telephones. However, supporting multi-bands and multi-modes in smaller mobile communication equipment is very difficult. The conventional approach is to integrate available receiver or transceiver ICs for Bluetooth, GPS, Cellular band transceiver, WiFi, etc. . . . , which is not an ideal approach to minimize cost and circuit area.

It would therefore be desirable to provide a quadrature bandpass-sampling technique that makes it possible to down-convert and digitize RF signals in excess amount of signal bandwidth. In such a system, several RF signals in various frequency bands would be frequency-shifted to form a cluster of signals at a high intermediate frequency, wherein demodulation and digitization can be applied to simultaneously down-convert all RF signals of interest to a second low intermediate frequency. A second digital down-conversion can be then applied on all the frequency-shifted RF signals to achieve simultaneous demodulation to baseband.

SUMMARY OF THE INVENTION

This invention features a demodulating and digitizing circuit, comprising: a wideband low-noise amplifier configured to generate N low-noise radio frequency (RF) signals based on N received RF signals, the N received having N different RF signal frequencies, respectively; N filters configured to filter the N low-noise RF signals, respectively, to generate N filtered RF signals; a clock generator configured to generate N first mixing clock signals having N different first mixing frequencies, respectively; N mixers configured to mix the N filtered RF signals with the N mixing clock signals, respectfully, to generate N first frequency-shifted RF signals; a summer circuit configured to combine the N first frequency-shifted RF signals to generate an aggregate first-intermediate-frequency (first-IF) signal having a first-IF bandwidth; a sampling clock generator configured to generate a first sampling clock having a first sampling clock frequency, an in-phase sampling clock having an in-phase sampling clock frequency, and a quadrature sampling clock having a quadrature sampling clock frequency, the quadrature sampling clock frequency being ninety degree out of phase with the in-phase sampling clock frequency; a quadrature bandpass-sampling analog-to-digital demodulator configured to digitize and frequency-shift the aggregate first-IF signal to generate an in-phase aggregate second-IF signal based on the in-phase sampling clock, and generate a quadrature aggregate second-IF signal based on the quadrature sampling clock; a decimation low-pass filter configured to filter the in-phase second-IF signal based on the first sampling clock to generate an in-phase K-bit second-IF signal, and filter the quadrature second-IF signal based on the first sampling clock to generate a quadrature K-bit second-IF signal; and N digital down converters configured to generate N second mixing clock signals responsive to the first sampling clock, the N second mixing clock signals having N different second mixing frequencies, respectively, and generate N demodulated RF signals based on the N second frequency-shifted RF signals embedded in both the in-phase K-bit second-IF signal and the quadrature K-bit second IF signal, responsive to the N second mixing clock signals, respectively, wherein the in-phase second-IF signal and the quadrature second-IF signal are both digital bi-level signals, and the in-phase K-bit second-IF signal and the quadrature K-bit second-IF signal each have K bits of resolution, N is an integer greater than 0, and K is an integer greater than 0; wherein the N first frequency-shifted RF signals are all located below the first IF frequency; wherein the N first frequency-shifted RF signals are all located above the first IF frequency; wherein the N first frequency-shifted RF signals are distributed both above and below the first IF frequency; wherein i is an index value that ranges from 1 to N, an $i^{th}$ filter is one of a low-pass or bandpass filter the $i^{th}$ low-noise RF signal frequency is below the first IF frequency, and the $i^{th}$ filter is one of a high-pass or bandpass filter the $i^{th}$ low-noise RF signal frequency is above the first IF frequency; wherein the first IF frequency is between 1 GHz and 4 GHz; wherein the first sampling clock frequency, the in-phase sampling clock frequency, and the quadrature sampling clock frequency are all equal to the first IF frequency; wherein N is greater than or equal to 1, and is less than or equal to 10; wherein j is an index value that ranges from 1 to (N−1), the N first frequency-shifted RF signals have N first center frequencies, respectively, the N first center frequencies are all different, none of the N first center frequencies are equal to the first IF frequency, and a difference between a $i^{th}$ center frequency of a $j^{th}$ first frequency-shifted RF signal, and a $(j+1)^{th}$ center frequency of a $(j+1)^{th}$ first frequency-shifted RF signal is a sub-multiple of the first IF frequency; wherein the first-IF bandwidth is less than the quadrature bandpass-sampling analog-to-digital demodulator input bandwidth, and the quadrature bandpass-sampling analog-to-digital demodulator input bandwidth is between 5 MHz and 100 MHz; wherein K is greater than or equal to 6, and is less than or equal to 24; wherein i is an index value that ranges from 1 to N, and the N second frequency-shifted RF signals have N second center frequencies, respectively, an $i^{th}$ second mixing clock frequency is equal to an $i^{th}$ second center frequency of an $i^{th}$ second frequency-shifted RF signal.

The invention also features a method for demodulating and digitizing signals, comprising: receiving a plurality of RF signals at different frequencies and generating a plurality of demodulated and digitized RF signals comprising: amplifying N received RF signals to generate N low-noise RF signals, respectively; filtering the N low-noise RF signals to generate N filtered RF signals, respectively; generating N different first mixing clock signals having N different first mixing frequencies, respectively; mixing the N filtered RF signals with the N first mixing clock signals, respectfully, to generate N first frequency-shifted RF signals; combining the N first frequency-shifted RF signals to generate an aggregate first-intermediate-frequency (first-IF) signal having a first-IF bandwidth; generating a first sampling clock signal having a first sampling clock frequency; generating an in-phase sampling clock having an in-phase sampling clock frequency; generating a quadrature sampling clock having a quadrature sampling clock frequency, the quadrature sampling clock frequency being ninety degree out of phase with the in-phase sampling clock frequency; bandpass-sampling and digitizing the aggregate first-IF signal to generate an in-phase aggregate second-IF signal based on the in-phase sampling clock, and generate a quadrature aggregate second-IF signal based on the quadrature sampling clock; filtering the in-phase second-IF signal based on the first sampling clock to generate an in-phase K-bit second-IF signal; filtering the quadrature second-IF signal based on the first sampling clock to generate a quadrature K-bit second-IF signal; generating N second mixing clock signals responsive to the first sampling clock, the N second mixing clock signals having N different second mixing frequencies, respectively, and generating N demodulated RF signals based on the N second frequency-shifted RF signals embedded in both the in-phase K-bit second-IF signal and the quadrature K-bit second IF signal, responsive to the N second mixing clock signals, respectively, wherein the in-phase second-IF signal and the quadrature second-IF signal are both digital bi-level signals, the in-phase K-bit second-IF signal and the quadrature K-bit second-IF signal each have K bits of resolution, N is an integer greater than 0, and K is an integer greater than 0; wherein the N first frequency-shifted RF signals are all located below the first IF frequency; wherein the N first frequency-shifted RF signals are all located above the first IF frequency; wherein the N first frequency-shifted RF signals are distributed both above and below the first IF frequency; wherein i is an index value that ranges from 1 to N, an $i^{th}$ filter is one of a low-pass or bandpass filter an $i^{th}$ low-noise RF signal frequency is below the first IF frequency, and the $i^{th}$ filter is one of a high-pass or bandpass filter the $i^{th}$ low-noise RF signal frequency is above the first IF frequency; wherein the first IF frequency is between 1 GHz to 4 GHz; wherein the first sampling clock frequency, the in-phase sampling clock frequency and the quadrature sampling clock frequency are all equal to the first IF frequency; wherein N is greater than or equal to 1, and is less than or equal to 10; wherein j is an index value that ranges from 1 to (N−1), the N first frequency-shifted RF signals have N first center frequencies, respectively, the N first center frequencies are all different, none of the N first center frequencies are equal to the first IF frequency, and a difference between a $j^{th}$ center frequency of a $j^{th}$ first frequency-shifted RF signal, and a $(j+1)^{th}$ center frequency of a $(j+1)^{th}$ first frequency-shifted RF signal is a sub-multiple of the first IF frequency; wherein the first-IF bandwidth is less than the quadrature bandpass-sampling analog-to-digital demodulator input bandwidth, and the quadrature bandpass-sampling analog-to-digital demodulator input bandwidth is between 5 MHz and 100 MHz; wherein K is greater than or equal to 6, and is less than or equal to 24; wherein i is an index value that ranges from 1 to N, and the N second frequency-shifted RF signals have N second center frequencies, respectively, an $i^{th}$ second mixing clock frequency is equal to an $i^{th}$ second center frequency of an $i^{th}$ second frequency-shifted RF signal.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

In overview, the present disclosure concerns electronic devices or units, some of which are referred to as communication units, such as cellular phone or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Figure 1A:
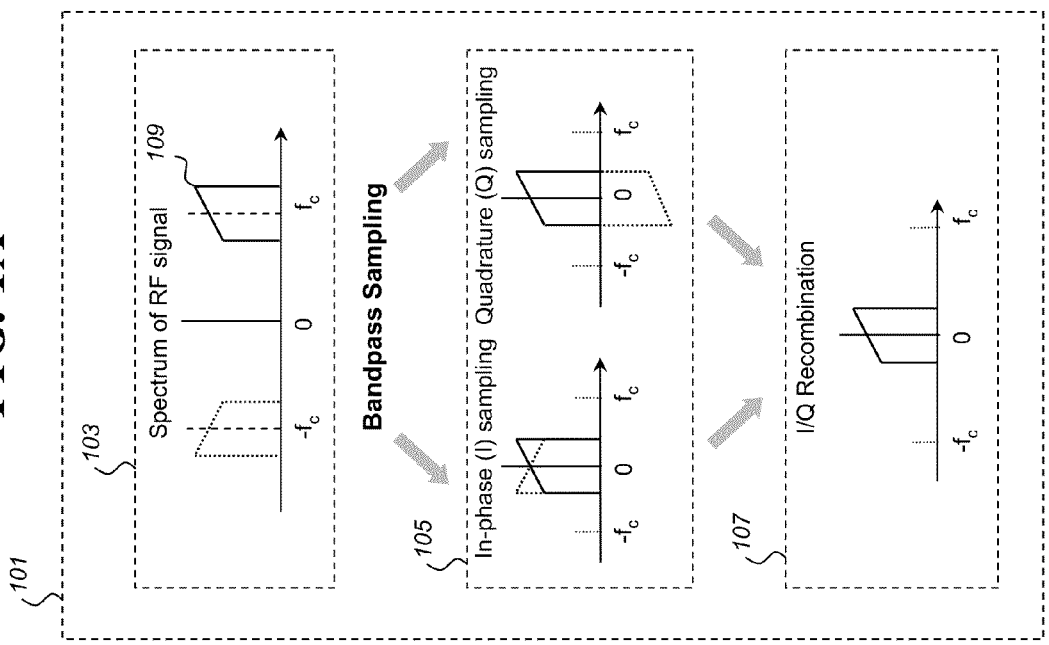
FIGS. 1A and 1B are frequency diagram and timing diagrams illustrating down-conversion to baseband based on the bandpass-sampling theory.
Figure 1B:
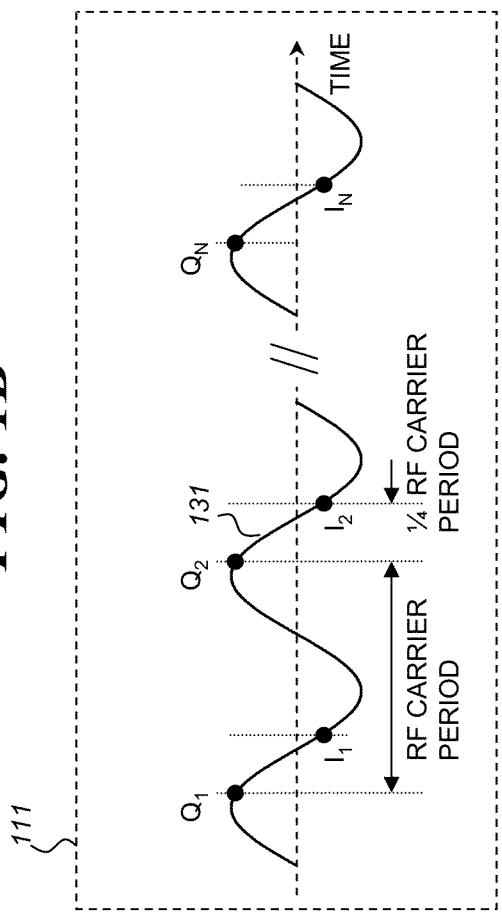

Referring now to FIGS. 1A and 1B, a frequency diagram 101 and timing diagram 111 are provided, illustrating the down-conversion of an RF signal to the baseband frequency based on the bandpass-sampling theory. A communication transmitter is employed to modulate the information to a carrier frequency k, and to transmit the RF signal over the air. For example, conventional cellular phone carrier frequencies are currently set at either 900 MHz or 1800 MHz. In the frequency domain, the transmitted information 109 in the frequency diagram 103 can be seen centered at the carrier frequency k, where the width of a shaped object corresponds to the bandwidth of the transmitted information. As shown in FIG. 1A, the transmitted object is mirrored at the negative frequencies along the zero-frequency axis.

The timing diagram 111 illustrates a sinusoidal waveform 131 at the RF carrier frequency. The in-phase and quadrature signals that carry the communicating information slowly modulate the amplitude and/or the phase of the sinusoidal waveform 131, depending on the modulation scheme employed in the communication system. In a quadrature bandpass-sampling receiver, the sampling rate is set to be equal to the RF carrier frequency k, and only two respective sampled data points for every period of the RF carrier are captured, as shown in the timing diagram 111. The first sequence of sampled data points $I_1, I_2, \ldots, I_N$ corresponds to the in-phase (I) sequence while the second sequence of sampled data points $Q_1, Q_2, \ldots, Q_N$ corresponds to the quadrature (Q) sequence. Note that the time duration in between adjacent sampled points of each sequence is always, $$\frac{1}{f_c},$$

the RF carrier period, and the time duration between a Q sampled point and an adjacent I sampled point is always, $$\frac{1}{4f_c},$$

or one quarter of the RF carrier period.

Bandpass sampling the sinusoidal waveform 131 removes the high frequency RF waveform and retains only the slowly-varying amplitude and/or phase of the communicating information that was modulated to the RF carrier frequency. By virtue of the bandpass sampling theory, the in-phase and quadrature modulated signals are down-converted to baseband, or DC, as illustrated in the frequency diagram 105 of FIG. 1. The sampled I and Q sequences can be recombined to reconstruct the transmitted in-phase and quadrature signals as shown in the frequency diagram 107.

Figure 2A:
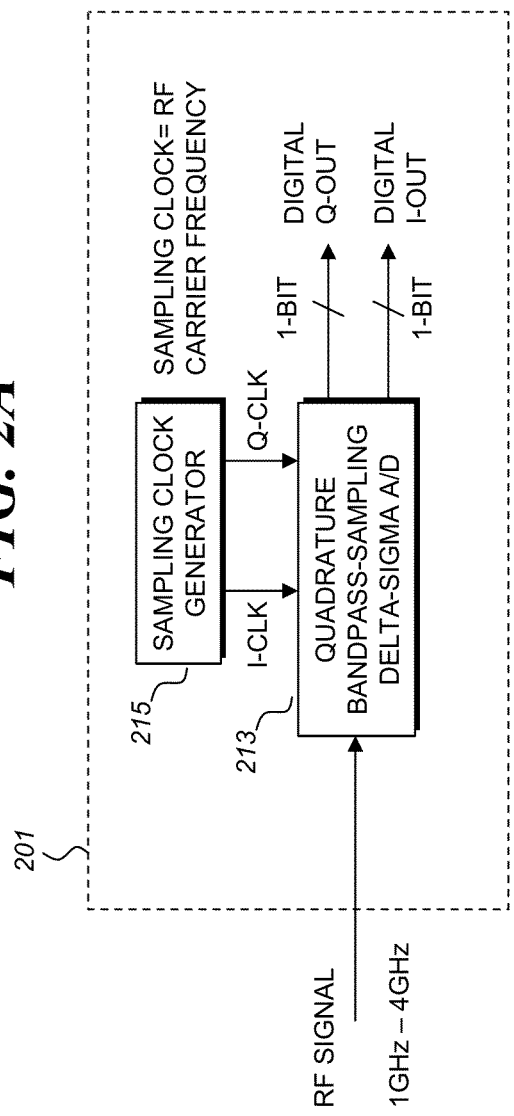
FIG. 2A is a schematic diagram illustrating a conventional quadrature bandpass-sampling delta-sigma receiver.
Figure 2B:
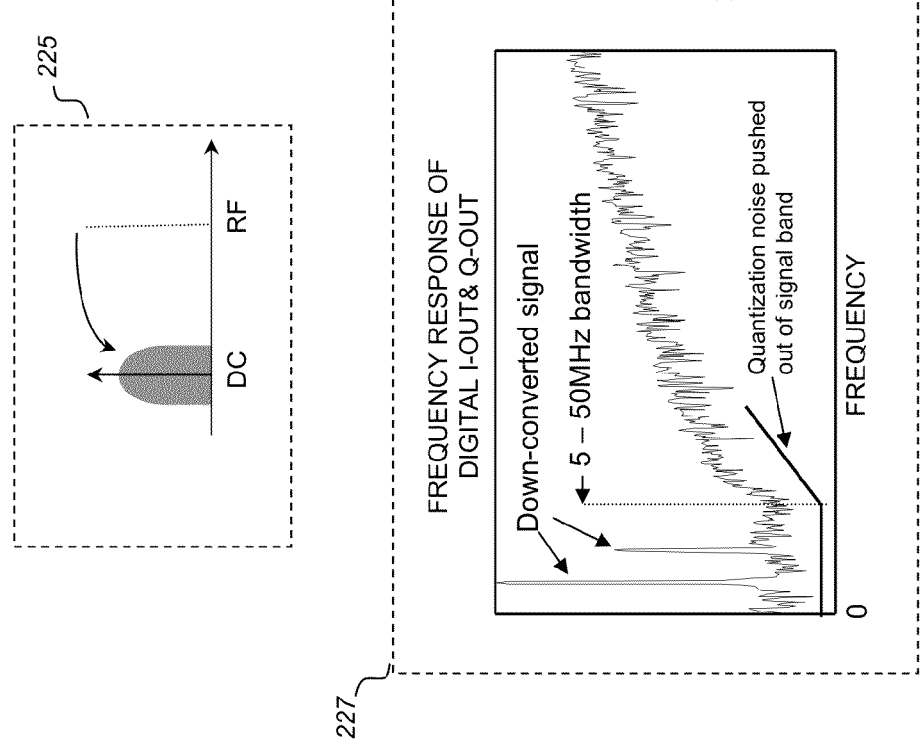
FIG. 2B are graphs illustrating output signals of the receiver in FIG. 2A.

FIG. 2A is a schematic diagram illustrating a conventional quadrature bandpass-sampling receiver 201. As shown in FIG. 2A, the receiver 201 comprises a sampling clock generator 215, and a quadrature bandpass-sampling delta sigma analog-to-digital demodulator (QBS-ADD) 213. FIG. 2B shows the frequency diagrams 225, and 227 that illustrate the frequency characteristics of the QBS-ADD 213 output signals, I-OUT and Q-OUT.

The RF signal, which is located between 1 GHz and 4 GHz, is bandpass-sampled by the QBS-ADD 213 based on the in-phase clock I-CLK and quadrature clock Q-CLK, which are generated by the sampling clock generator 215. As discussed with respect to FIG. 1B, the in-phase clock and the quadrature clock are separated from each other by ninety degrees. The communicating in-phase and quadrature information embedded in the RF signal are demodulated to baseband by the in-phase and quadrature clocks I-CLK and Q-CLK, respectively, thereby generating the corresponding digital I-OUT and Q-OUT signals. The frequency diagram 225 illustrates the signal demodulation to baseband from the RF frequency by the QBS-ADD 213. Unlike other conventional RF receivers where the in-phase and quadrature demodulated signals are digitized by a pair of A/Ds at high-resolution and low sampling rate, the QBPS-ADD 213 is a delta-sigma type converter, which produces a stream of bi-level digital I-OUT and Q-OUT signals clocked at a sample rate equal to the RF signal carrier frequency. The frequency diagram 227 illustrates the spectrum profile of typical I-OUT and Q-OUT signals. Even though in the disclosed embodiment, the QBS-ADD outputs have 1-bit resolution, the quantization noise is pushed out of the signal band, typically between 5 to 50 MHz, yielding high-resolution I-OUT and Q-OUT signals.

Figure 3A:
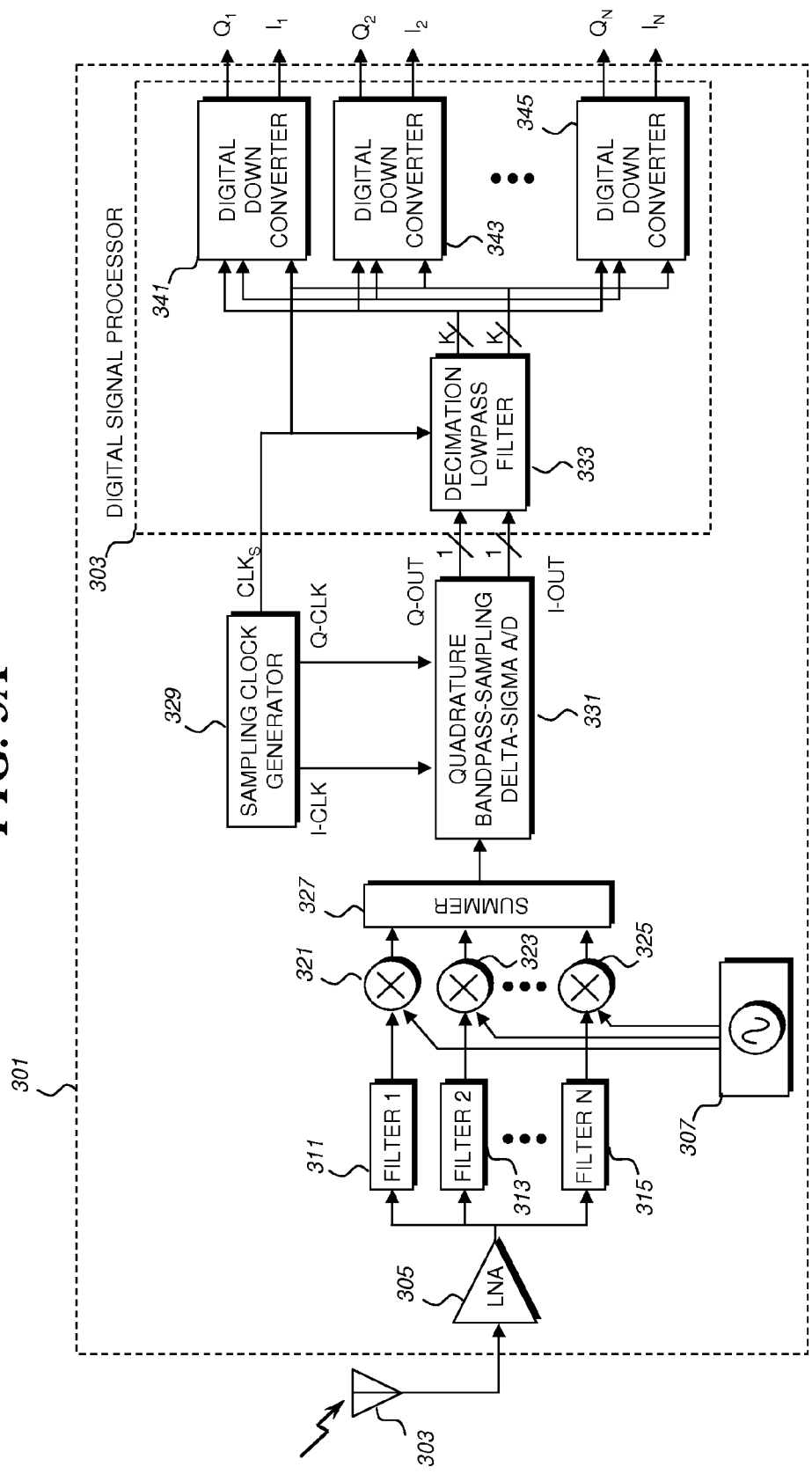
FIG. 3A is a schematic diagram illustrating an exemplary multi-channel bandpass-sampling delta-sigma receiver according to disclosed embodiments.

FIG. 3A is a schematic diagram illustrating an exemplary multi-channel bandpass sampling receiver 301 in accordance with one or more embodiments. As shown ion FIG. 3A, the multi-channel bandpass sampling receiver 301 comprises a low-noise amplifier LNA 305, first through $N^{th}$ image reject filters 311, 313, 315, first through $N^{th}$ mixers 321, 323, 325, a multi-frequency clock generator 307, a summer 327, a sampling clock generator 329, a quadrature bandpass-sampling delta-sigma analog to digital demodulator (QBS-ADD) 331, and a digital signal processor 303. The digital signal processor 303 further comprises a decimation lowpass filter 333, and a plurality of digital down-converters 341, 343, and 345.

Figure 3B:
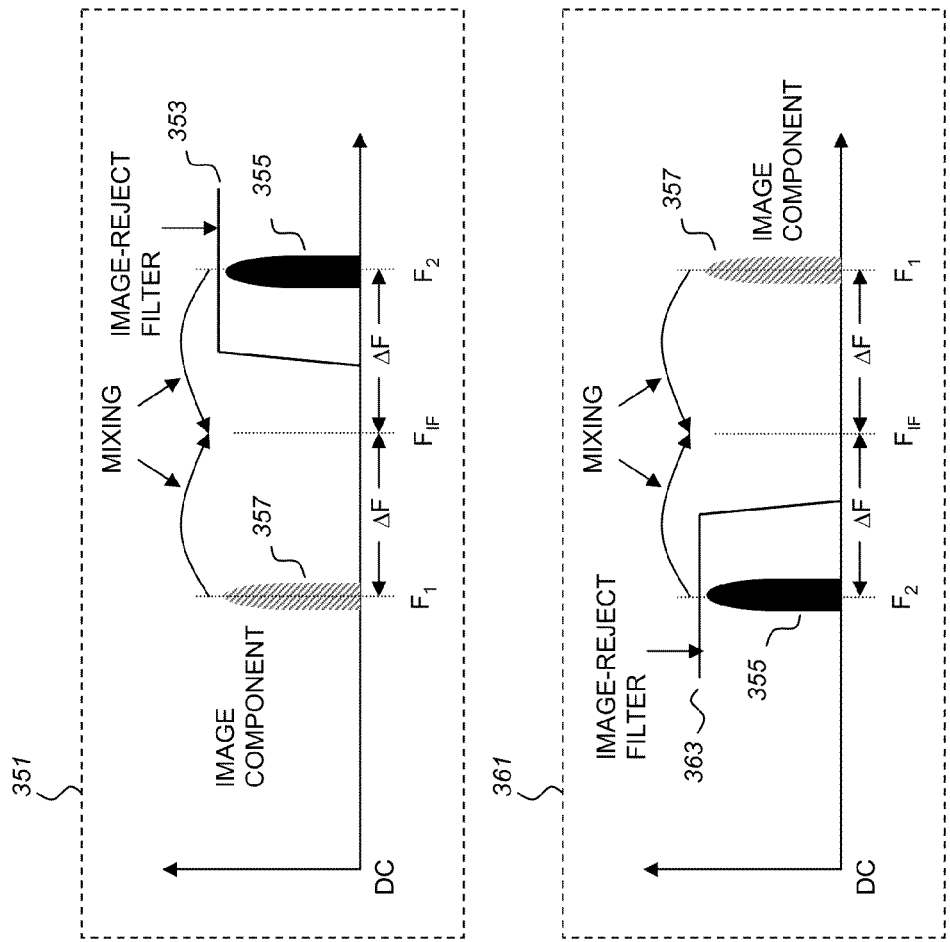
FIG. 3B are frequency diagrams illustrating frequency shifting to an intermediate frequency and image reject filtering.

FIG. 3B illustrates two frequency diagrams 351 and 361 illustrating frequency shifting of an RF signal 355 to an intermediate frequency (IF) using a mixer, and the associated issue with the "image component". Frequency diagram 351 illustrates an RF signal 355 located at a frequency $F_2$, which is above an intermediate frequency, $F_{IF}$. When using a mixer to frequency shift the RF signal 355 at frequency $F_2$ to $F_{IF}$, a mixing frequency, which is equal to the difference between $F_2$ and $F_{IF}$, or $\Delta F$, is needed. In this case, when mixing the RF signal located at frequency $F_2$ with $\Delta F$, the RF signal 355 is frequency shifted to $F_{IF}$ as illustrated in the frequency diagram 351. However, the mixing process can cause an image component 357 located at frequency $F_1$ to be frequency shifted to $F_{IF}$ as well, because the difference between $F_{IF}$ and $F_1$ is also $\Delta F$. The co-location of the image component 357 and the RF signal 355 at $F_{IF}$ will cause signal interference and the information contained in the RF signal 355 can not be extracted.

To resolve image component issue, filtering is needed to remove the image before mixing. When the RF signal 355 is located above the intermediate frequency, $F_{IF}$, a high-pass filter, or the image-reject filter 353, is required as shown in the frequency diagram 351. The cut-off frequency of the image-reject filter 353 is set well above the image component frequency, $F_1$, to provide enough attenuation of the image component 357. Likewise, when the RF signal 355 is located below the intermediate frequency, $F_{IF}$, a low-pass filter, or image-reject filter 363, is required as shown in the frequency diagram 361. The cut-off frequency of the image-reject filter 363 must be set well below the image component frequency, $F_1$, to provide enough attenuation of the image component 357. As the image component 357 is filtered, the sub-sequent mixing process can still cause the overlap of the filtered image component onto the RF signal 355 at the intermediate frequency, $F_{IF}$. However, the filtered image component will not cause much interference to the RF signal 355.

Referring back to FIG. 3A, multiple channels at different RF carrier frequencies, which range from as low as 100 MHz to as high as 4 GHz, are captured by the antenna 303 and are amplified by the LNA 305 to improve the signal-to-noise ratio (SNR). The LNA 305 is a wide-band type amplifier capable of covering frequencies from DC to 4 GHz. The receiver is assumed to capture a number N of RF signals, where N ranges from 1 to 10, and other undesirable RF components, or image components as the LNA 305 has very wide bandwidth. Each of these N RF signals is filtered to remove an image or adjacent unwanted components before mixing by the first filter 311, the second filter 313, up through the $N^{th}$ filter 315. In the disclosed embodiment, the first intermediate frequency (IF) at the input of the QBS-ADD 331 is set to be between 1 GHz and 4 GHz. Therefore, for any RF signal modulated by a carrier frequency below the first IF, a low-pass filter is needed to remove the image of the signal above the first IF. Likewise, a bandpass filter can also be used to further remove any adjacent unwanted RF components. For any RF signal modulated by a carrier frequency above the first IF, a high-pass filter is needed to remove the image of the signal below the first IF. Likewise, a bandpass filter can also be used to further remove any adjacent unwanted RF components.

The clock generator 307 in FIG. 3A generates the appropriate mixing frequencies to frequency shift all the N RF signals to the first IF band. Frequency-shifting is done by the first through $N^{th}$ mixers 321, 323, 325 on the filtered RF signals at the output of the first filter 311, the second filter 313, up to the $N^{th}$ filter 315, respectively, with the appropriate mixing frequencies generated by the clock generator 307. All of the frequency-shifted RF signals are combined together by the summer 327.

Figure 4:
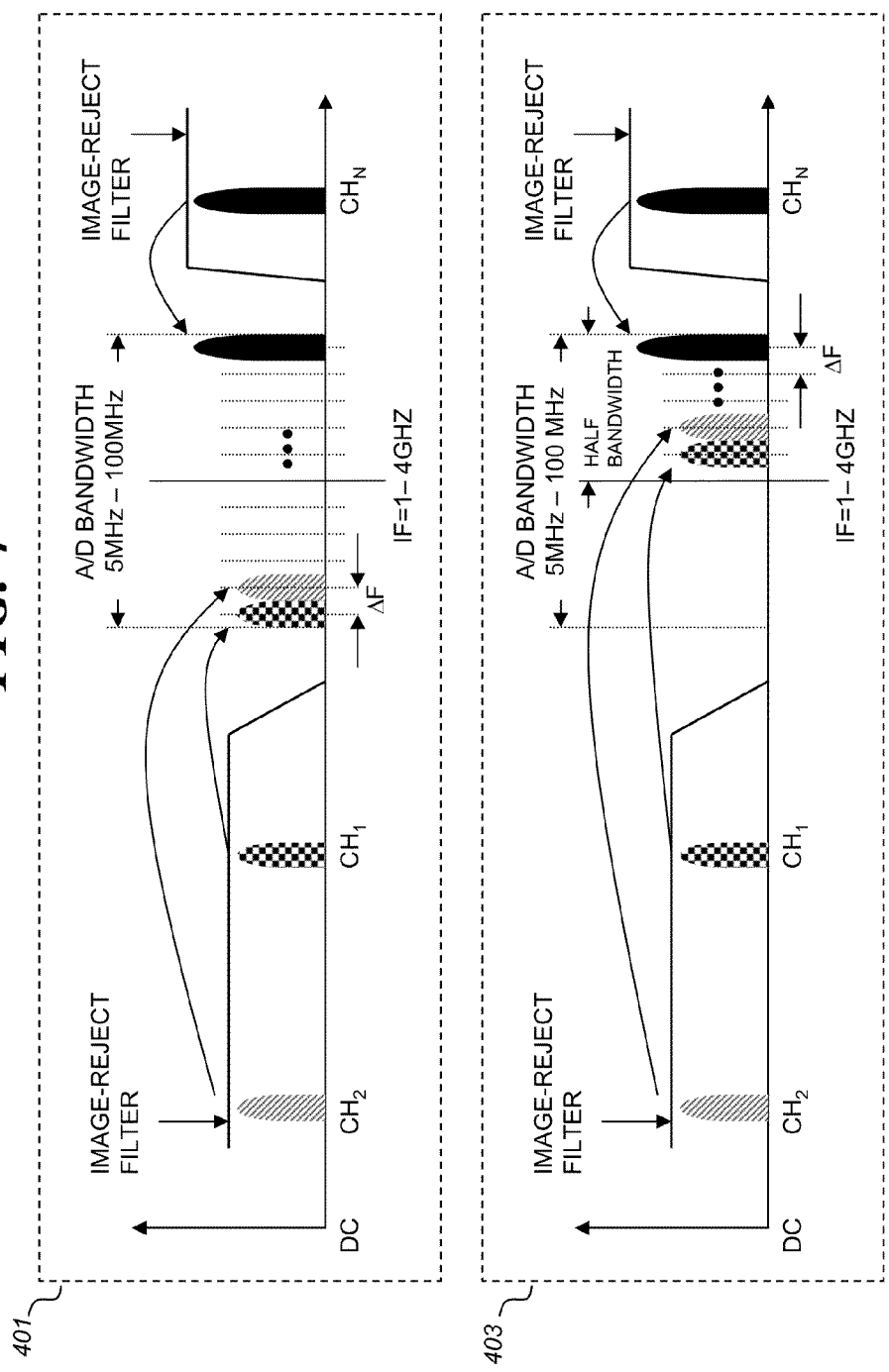
FIG. 4 is a frequency diagram illustrating frequency shifting of RF signals to a high intermediate frequency according to disclosed embodiments.

FIG. 4 is a graph illustrating the frequency-shifting of all N RF signals to the first IF band at the input of the QBS-ADD 331. It includes a first frequency diagram 401 and a second frequency diagram 403.

The first frequency diagram 401 illustrates the frequency-shifting of the RF signals $CH_1$, $CH_2$, ..., $CH_N$ to the full IF band; i.e. all of the frequency-shifted RF components occupy the full QBS-ADD 331 bandwidth whose center coincides with the first IF. The full bandwidth of the QBS-ADD 331 can range from 5 MHz to 100 MHz, and the first IF can be set between 1 GHz to 4 GHz. As shown in the frequency diagram 401, and mentioned above, a low-pass filter is required for any RF signal below the first IF to remove the image components above the first IF, whereas a high-pass filter is required for any RF signal above the first IF to remove the image components below the first IF.

The second frequency diagram 403 illustrates the frequency-shifting of the RF signals $CH_1$, $CH_2$, ..., $CH_N$ to the half IF band; i.e. all of the frequency-shifted RF components occupy only one-half of the bandwidth of the QBS-ADD 331. In the frequency diagram 403, the upper half of the QBS-ADD 331 above the IF is used to contain the frequency-shifted RF components.

Although not shown in the first or second frequency diagrams 401, 403, in alternate embodiments. the frequency-shifted RF components can be designed to occupy the lower half of the QBS-ADD 331 bandwidth below the first IF.

Either in full bandwidth or half bandwidth mode, the RF signals are placed near the first IF such that the difference in frequency between two adjacent frequency-shifted RF signals, denoted by $\Delta F$, must be a sub-multiple of the first IF frequency.

The sampling clock generator 329 in FIG. 3A produces a first sampling clock $CLK_S$, an in-phase sampling clock I-CLK, and a quadrature sampling clock Q-CLK, all of which have the same frequency, all of which have a frequency equal to the first IF. Also, I-CLK and Q-CLK are ninety degrees out of phase with each other. By virtue of the bandpass sampling theory, the QBS-ADD 331 demodulates all of the frequency-shifted RF signals down to a second IF band using the in-phase sampling clock I-CLK, and the quadrature sampling clock Q-CLK. Streams of bi-level in-phase digital output I-OUT, and quadrature digital output Q-OUT which carry the in-phase and quadrature down-converted RF signals, respectively, are generated. The decimation low-pass filter 333 uses the first sampling clock $CLK_S$, to latch the I-OUT and Q-OUT output signals, to filter the quantization noise, to decimate the sampling clock to a slower sampling clock, and to generate K-bit resolution versions of I-OUT and Q-OUT, respectively.

Figure 5:
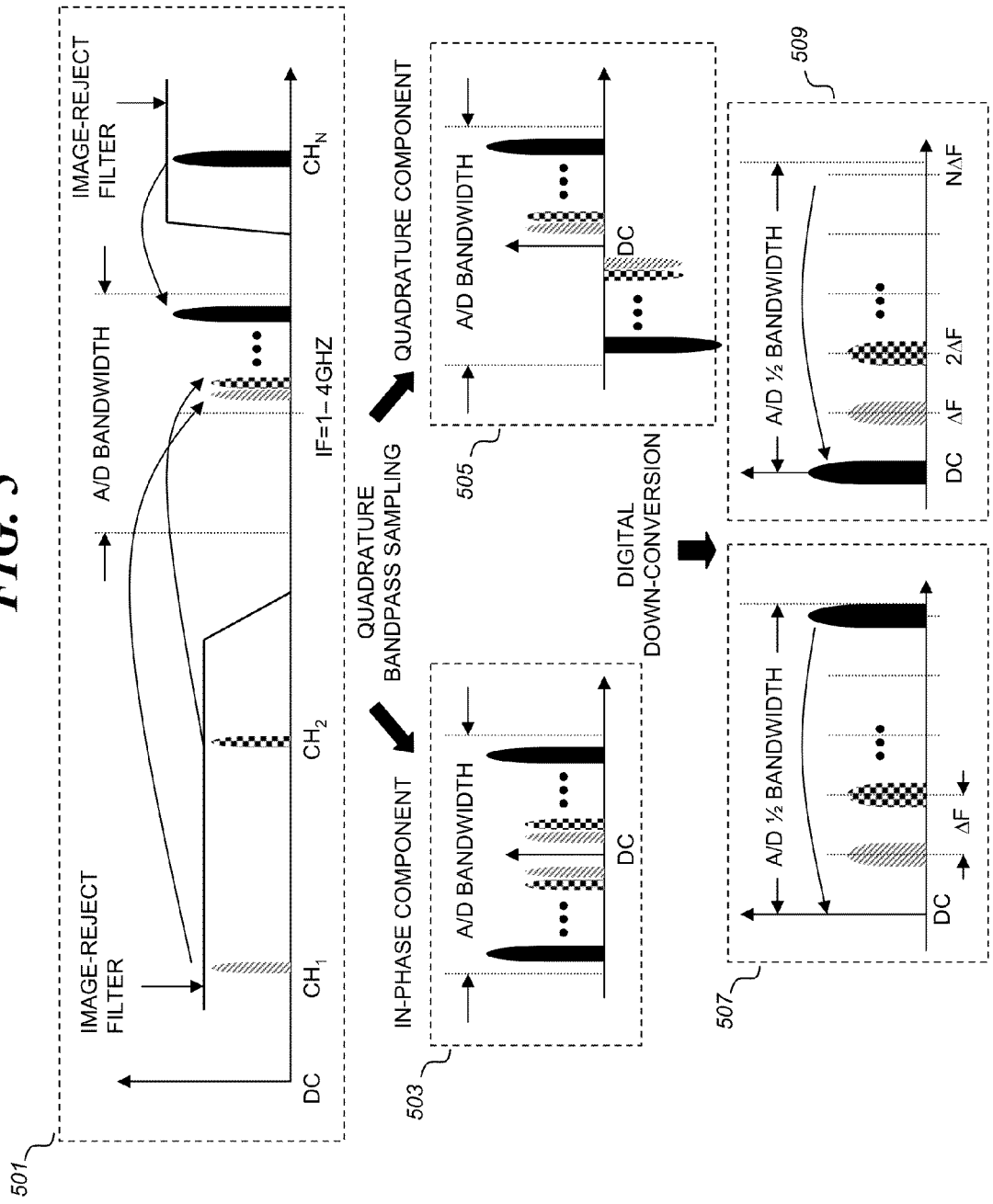
FIG. 5 is a frequency diagram illustrating down-conversion of RF signals from the intermediate frequency according to disclosed embodiments.

FIG. 5 is a graph illustrating the down-conversion of the frequency-shifted RF signals from the first IF band to the second IF band for the half-bandwidth QBS-ADD case. It includes a third frequency diagram 501, a fourth frequency diagram 503, a fifth frequency diagram 505, a sixth frequency diagram 507, and a seventh frequency diagram 509. The third frequency diagram 501 illustrates the mixing of the RF signals to the upper half of the QBS-ADD bandwidth at the first IF. The QBS-ADD 331 down-converts and produces the in-phase component using the in-phase sampling clock I-CLK, as shown in the fourth frequency diagram 503. Likewise, the QBS-ADD 331 down-converts and produces the quadrature component using the quadrature sampling clock Q-CLK, as shown in the fifth frequency diagram 505. After removal of the quantization noise and decimation of the sampling frequency by the decimation low-pass filter 333, the frequency spectrum of the K-bit I-OUT is also represented by fourth the frequency diagram 503, and the frequency spectrum of the K-bit Q-OUT is also represented by the fifth frequency diagram 505.

As shown in the sixth frequency diagram 507, the frequency-shifted RF signals at the first IF have been frequency-shifted to a second low IF, wherein each RF component is placed at a multiple of $\Delta F$ away from DC. Demodulation of each RF component to baseband can be done in the digital domain by the digital down-converters 341, 343, and 345 in FIG. 3A, thereby producing N demodulated in-phase and quadrature RF signals at the quadrature bandpass sampling receiver 301 output.

For the half QBS-ADD bandwidth case, each digital down converter 341, 343, or 345 can generate a digital mixing clock from the sampling rate clock $CLK_S$, that matches with the frequency location of the corresponding RF component in the second IF band. The K-bit I-OUT signal and the K-bit Q-OUT signal are then mixed with these digitized mixing clocks to produce the in-phase and quadrature outputs down-converted to DC, respectively. For example, in order to down convert an $N^{th}$ channel $CH_N$, in the sixth frequency diagram 507 of FIG. 5 to DC, and to generate the corresponding in-phase component, $I_N$, and quadrature component, $Q_N$, a digital mixing clock that is N times $\Delta F$ ($N \cdot \Delta F$) in frequency is needed in the digital down-converter 345. The seventh frequency diagram 509 illustrates the digital down conversion of the frequency-shifted RF signal $CH_N$ to baseband. Likewise, a digital mixing clock of frequency $\Delta F$ ($1 \cdot \Delta F$) is required in the digital down-converter 341 to down-convert the first channel $CH_1$, to DC to generate the corresponding in-phase component, $I_1$, and quadrature component, $Q_1$.

For the full QBS-ADD bandwidth case, the first frequency diagram 401 in FIG. 4 shows that the first channel $CH_1$, and the $N^{th}$ channel $CH_N$ are images of each other in the second IF band because they are mirrors of each other along the first IF axis, and the first IF frequency is mapped to DC by the bandpass sampling of the QBS-ADD 331. Therefore, the conventional Hartley image reject architecture can be implemented in the digital down-converters 341, 343 and 345 to resolve the imaged channels and the appropriate digital mixing clock is used to demodulate each channel to DC.

It should be noted that the term communication unit may be used herein to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wideband networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof.

Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A demodulating and digitizing circuit, comprising:
    a wideband low-noise amplifier configured to generate N low-noise radio frequency (RF) signals based on N received RF signals, the N received RF signals having N different RF signal frequencies, respectively;
    N filters configured to filter the N low-noise RF signals, respectively, to generate N filtered RF signals;
    a clock generator configured to generate N first mixing clock signals having N different first mixing frequencies, respectively;
    N mixers configured to mix the N filtered RF signals with the N mixing clock signals, respectfully, to generate N first frequency-shifted RF signals;
    a summer circuit configured to combine the N first frequency-shifted RF signals to generate an aggregate first-intermediate-frequency (first-IF) signal having a first-IF bandwidth;
    a sampling clock generator configured to generate a first sampling clock having a first sampling clock frequency, an in-phase sampling clock having an in-phase sampling clock frequency, and a quadrature sampling clock having a quadrature sampling clock frequency, the quadrature sampling clock frequency being ninety degree out of phase with the in-phase sampling clock frequency;
    a quadrature bandpass-sampling analog-to-digital demodulator configured to digitize and frequency-shift the aggregate first-IF signal to
        generate an in-phase aggregate second-IF signal based on the in-phase sampling clock, and
        generate a quadrature aggregate second-IF signal based on the quadrature sampling clock;
    a decimation low-pass filter configured to
        filter the in-phase second-IF signal based on the first sampling clock to generate an in-phase K-bit second-IF signal, and
        filter the quadrature second-IF signal based on the first sampling clock to generate a quadrature K-bit second-IF signal; and
    N digital down converters configured to
        generate N second mixing clock signals responsive to the first sampling clock, the N second mixing clock signals having N different second mixing frequencies, respectively, and
        generate N demodulated RF signals based on the N second frequency-shifted RF signals embedded in both the in-phase K-bit second-IF signal and the quadrature K-bit second IF signal, responsive to the N second mixing clock signals, respectively,
    wherein
    the in-phase second-IF signal and the quadrature second-IF signal are both digital bi-level signals, and
    the in-phase K-bit second-IF signal and the quadrature K-bit second-IF signal each have K bits of resolution,
    N is an integer greater than 1, and
    K is an integer greater than 0.

2. The circuit of claim 1, wherein the N first frequency-shifted RF signals are all located below the first IF frequency.

3. The circuit of claim 1, wherein the N first frequency-shifted RF signals are all located above the first IF frequency.

4. The circuit of claim 1, wherein the N first frequency-shifted RF signals are distributed both above and below the first IF frequency.

5. The circuit of claim 1, wherein
i is an index value that ranges from 1 to N,
an $i^{th}$ filter is one of a low-pass or bandpass filter the $i^{th}$ low-noise RF signal frequency is below the first IF frequency, and
the $i^{th}$ filter is one of a high-pass or bandpass filter the $i^{th}$ low-noise RF signal frequency is above the first IF frequency.

6. The circuit of claim 1, wherein
the first IF frequency is between 1 GHz and 4 GHz.

7. The circuit of claim 1, wherein the first sampling clock frequency, the in-phase sampling clock frequency, and the quadrature sampling clock frequency are all equal to the first IF frequency.

8. The circuit of claim 1, wherein N is greater than 1, and is less than or equal to 10.

9. The circuit of claim 1, wherein
j is an index value that ranges from 1 to (N−1),
the N first frequency-shifted RF signals have N first center frequencies, respectively,
the N first center frequencies are all different,
none of the N first center frequencies are equal to the first IF frequency, and
a difference between a $j^{th}$ center frequency of a $j^{th}$ first frequency-shifted RF signal, and a $(j+1)^{th}$ center frequency of a $(j+1)^{th}$ first frequency-shifted RF signal is a sub-multiple of the first IF frequency.

10. The circuit of claim 1, wherein
the first-IF bandwidth is less than the quadrature bandpass-sampling analog-to-digital demodulator input bandwidth, and
the quadrature bandpass-sampling analog-to-digital demodulator input bandwidth is between 5 MHz and 100 MHz.

11. The circuit of claim 1, wherein K is greater than or equal to 6, and is less than or equal to 24.

12. The circuit of claim 1, wherein
i is an index value that ranges from 1 to N, and
the N second frequency-shifted RF signals have N second center frequencies, respectively,
an $i^{th}$ second mixing clock frequency is equal to an $i^{th}$ second center frequency of an $i^{th}$ second frequency-shifted RF signal.

13. A method for demodulating and digitizing signals, comprising:
receiving a plurality of RF signals at different frequencies and generating a plurality of demodulated and digitized RF signals comprising:
amplifying N received RF signals to generate N low-noise RF signals, respectively;
filtering the N low-noise RF signals to generate N filtered RF signals, respectively;
generating N different first mixing clock signals having N different first mixing frequencies, respectively;
mixing the N filtered RF signals with the N first mixing clock signals, respectfully, to generate N first frequency-shifted RF signals;
combining the N first frequency-shifted RF signals to generate an aggregate first-intermediate-frequency (first-IF) signal having a first-IF bandwidth;
generating a first sampling clock signal having a first sampling clock frequency;
generating an in-phase sampling clock having an in-phase sampling clock frequency;
generating a quadrature sampling clock having a quadrature sampling clock frequency, the quadrature sampling clock frequency being ninety degree out of phase with the in-phase sampling clock frequency;
bandpass-sampling and digitizing the aggregate first-IF signal to
generate an in-phase aggregate second-IF signal based on the in-phase sampling clock, and
generate a quadrature aggregate second-IF signal based on the quadrature sampling clock;
filtering the in-phase second-IF signal based on the first sampling clock to generate an in-phase K-bit second-IF signal;
filtering the quadrature second-IF signal based on the first sampling clock to generate a quadrature K-bit second-IF signal;
generating N second mixing clock signals responsive to the first sampling clock, the N second mixing clock signals having N different second mixing frequencies, respectively, and
generating N demodulated RF signals based on the N second frequency-shifted RF signals embedded in both the in-phase K-bit second-IF signal and the quadrature K-bit second IF signal, responsive to the N second mixing clock signals, respectively,
wherein
the in-phase second-IF signal and the quadrature second-IF signal are both digital bi-level signals,
the in-phase K-bit second-IF signal and the quadrature K-bit second-IF signal each have K bits of resolution,
N is an integer greater than 1, and
K is an integer greater than 0.

14. The method of claim 13, wherein the N first frequency-shifted RF signals are all located below the first IF frequency.

15. The circuit of claim 13, wherein the N first frequency-shifted RF signals are all located above the first IF frequency.

16. The circuit of claim 13, wherein the N first frequency-shifted RF signals are distributed both above and below the first IF frequency.

17. The method of claim 13, wherein
i is an index value that ranges from 1 to N,
an $i^{th}$ filter is one of a low-pass or bandpass filter an $i^{th}$ low-noise RF signal frequency is below the first IF frequency, and
the $i^{th}$ filter is one of a high-pass or bandpass filter the $i^{th}$ low-noise RF signal frequency is above the first IF frequency.

18. The method of claim 13, wherein the first IF frequency is between 1 GHz to 4 GHz.

19. The method of claim 13, wherein the first sampling clock frequency, the in-phase sampling clock frequency and the quadrature sampling clock frequency are all equal to the first IF frequency.

20. The method of claim 13, wherein N is greater than 1, and is less than or equal to 10.

21. The method of claim 13, wherein
j is an index value that ranges from 1 to (N−1),
the N first frequency-shifted RF signals have N first center frequencies, respectively,
the N first center frequencies are all different,
none of the N first center frequencies are equal to the first IF frequency, and
a difference between a $j^{th}$ center frequency of a $j^{th}$ first frequency-shifted RF signal, and a $(j+1)^{th}$ center frequency of a $(j+1)^{th}$ first frequency-shifted RF signal is a sub-multiple of the first IF frequency.

22. The method of claim 13, wherein
the first-IF bandwidth is less than the quadrature bandpass-sampling analog-to-digital demodulator input bandwidth, and
the quadrature bandpass-sampling analog-to-digital demodulator input bandwidth is between 5 MHz and 100 MHz.

23. The method of claim 13, wherein K is greater than or equal to 6, and is less than or equal to 24.

24. The method of claim 13, wherein
i is an index value that ranges from 1 to N, and
the N second frequency-shifted RF signals have N second center frequencies, respectively,
an $i^{th}$ second mixing clock frequency is equal to an $i^{th}$ second center frequency of an $i^{th}$ second frequency-shifted RF signal.

* * * * *